Figure 1:
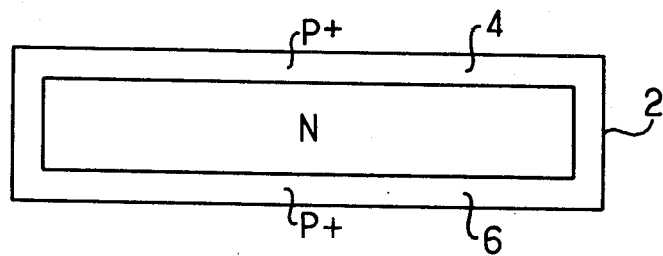

United States Patent [19]

André et al.

[11] 3,995,306
[45] Nov. 30, 1976

[54] REVERSE CONDUCTION THYRISTOR
[75] Inventors: Serge André, Draveil; Serge Lehmann, Sainte Genevieve des Bois, both of France
[73] Assignee: Societe Generale de Constructions Electriques et Mecaniques (ALSTHOM), Paris Cedex, France
[22] Filed: May 27, 1975
[21] Appl. No.: 581,350

[30] Foreign Application Priority Data
June 4, 1974   France ............................. 74.19226

[52] U.S. Cl. .................................. 357/38; 357/39; 357/86; 357/89; 357/90
[51] Int. Cl.² ........................................ H01L 29/74
[58] Field of Search .................. 357/38, 39, 89, 90, 357/86

[56] References Cited
UNITED STATES PATENTS

| | | |
|---|---|---|
| 3,099,591 | 7/1963 | Shockley .............................. 357/38 |
| 3,428,870 | 2/1969 | Davis .................................... 357/38 |
| 3,549,961 | 12/1970 | Gault .................................... 357/39 |

Primary Examiner—Michael J. Lynch
Assistant Examiner—Joseph E. Clawson, Jr.
Attorney, Agent, or Firm—Sughrue, Rothwell, Mion, Zinn & Macpeak

[57] ABSTRACT

The present invention concerns a reverse conduction thyristor. The diode integrated with the thyristor comprises a P + anode, an N layer having slight doping, an N + cathode intended for facilitating the electrical contact and, between the P + cathode and the slightly doped N layer, a thin extra layer of the P type whose presence increases the critical speed of increase of the direct voltage applied to the thyristor in its blocked state.

5 Claims, 8 Drawing Figures

REVERSE CONDUCTION THYRISTOR

The present invention concerns a reverse conduction thyristor, that is an integrated semi-conductor structure comprising a thyristor and a diode connected in parallel with opposite conduction directions. Such a structure is provided with two main terminals, one of which constitutes simultaneously the cathode of the thyristor and the anode of the diode and the other of which constitutes the anode of the thyristor and the cathode of the diode and with a trigger terminal enabling the firing of the thyristor when it is polarized in its forward direction.

Such reverse conduction thyristors can be used in many power circuits of the "chopper" type or current converters used at present and comprising a thyristor and a diode connected up in parallel with that thyristor, with the opposite conduction directions. The integration of these two components has the following advantages:
- Cancelling of the interference reactances of the connections.
- Simplifying of the assembling by omitting a housing and a cooling device.

That integration nevertheless constitutes a disadvantage which becomes apparent when the voltage applied to the integrated structure, in the reverse direction of the thyristor, changes its direction and increases rapidly in the forward direction of the thyristor, without any firing pulse being applied to the trigger. If the speed of increase of the direct voltage of the thyristor exceeds a value, called the "critical speed", a spurious firing of the thyristor then occurs and that critical speed is lower than in the case of an ordinary thyristor. This can be explained as follows: the thyristor and the diode have in common a layer with particularly slight doping, generally of the N type, which makes it possible for the thyristor to remain blocked when there is a high direct voltage. One zone of that "blocking layer" belongs to the diode and another belongs to the thyristor. When the voltage is applied in the reverse direction of the thyristor, the current crossing through the diode is accompanied by a great injection of positive holes in the zone of the blocking layer which belongs to the diode. Certain of these holes diffuse towards the zone of that same layer which belongs to the thyristor. When the direction of the applied voltage changes, the diode ceases to be conductive, but the holes which previously diffused in the blocking zone belonging to the thyristor disappear slowly by recombination. If the direct voltage which is then applied to the thyristor increases rapidly, these holes cause the firing of the latter.

To overcome that disadvantage, it is known method to provide an insulation zone between the part of the blocking layer belonging to the thyristor and that belonging to the diode, that is, without a break in the continuity of that layer, to separate these two zones by a third zone in which the holes of the diode diffusing towards the thyristor can be disappear to a great extent by recombination. But it is not possible in this way to reduce as much as required the concentration of holes remaining in the zone belonging to the thyristor, for the length of the insulation zone required for that would be excessive.

Another known general solution for preventing a spurious triggering of an ordinary thyristor consists in providing that thyristor with emitter short circuits. That solution can also be used to great advantage in the case of a reverse conduction thyristor. But it would then have only a limited efficiency.

Moreover, integrated semi-conductor structures a first part of which constitutes a conventional thyristor and a second part of which fulfills another function are also known. In the case of a bi-directional thyristor of the type known by the name of "Triac", that other function is to let the current pass in the reverse direction of the first part when the voltage has been reversed, this being so only from the instant when a triggering signal has been applied to a common control electrode. In the case of protected thyristors, the function of the second part is to let the current pass in the reverse direction of the first part when the voltage has been reversed and when it has exceeded a dangerous value where there is a risk of breakdown and of damage of the first part. On the contrary, in the case of reverse conduction thyristors, to which the present invention applies, the function of the second part is to make the current pass as soon as the voltage has been reversed and when there is no triggering signal.

In the case of bi-directional thyristors and of protected thyristors, the first part will be called hereinafter the thyristor part, for it alone comprises the conventional elements of a thyristor which are, going from a first face:
- A thyristor injection layer having high P doping
- A thyristor blocking layer having slight N doping
- A thyristor control layer having high P doping
- A thyristor emitter layer having high N doping
- A first and second main electrode in contact with the injection layer and with the emitter layer.
- A control electrode in contact with the control layer.

The second part of known bidirectional thyristors and of known protected thyristors comprises always, starting from the first face:
- A first secondary layer having doping of the N type.
- A second secondary layer of the P type.
- A third secondary layer having slight doping of the N type in continuity with the thyristor blocking layer.
- A fourth secondary layer having high doping of the P type in continuity with the control layer of the thyristor.

The first secondary layer has a thickness smaller than that of the thyristor injection layer.

The thickness of the second secondary layer extends throughout the remainder of the thickness of that thyristor injection layer and has a distribution of the concentration of doping impurities identical to that of that thyristor injection layer. A doping continuity existing between those two layers, that is to say that the concentrations are the same in both layers, at a same distance from the first face.

These concentrations decreases on moving away from the first face.

At the distance from the first face corresponding to the junction, between the first and second secondary layers, the concentration of impurities of the P type is very much greater than $10^{17}$ atoms per cubic centimeter, for example $10^{18}$ or $10^{19}$. Of course, at the surface of that junction, there exists an equal concentration of impurities of the N type, but that concentration decreases more rapidly than the concentration of impurities of the P type on moving away from the first face in the second secondary layer. When arriving at the middle of the thickness of that layer, the concentration of impurities of the N type is negligible and the concentration of impurities of the P type remains appreciably higher than $10^{17}$.

The present invention aims at producing a reverse conduction thyristor having a high value of the critical speed of increase of the direct voltage of the thyristor in the blocked state even when a reverse voltage has been applied to the thyristor in the instants preceding the applying of the direct voltage.

It has as its object a reverse conduction thyristor comprising:

— A semi-conductor plate with a first and a second face.

That plate comprising at least one thyristor zone and one diode zone each extending throughout the whole thickness of that plate, each taking up a part of the surface of that plate.

In the said thyristor zone, thyristor layers superimposed in the thickness of that plate in the following order from the said first face to the said second face.

A thyristor injection layer having high doping of a first type of conductivity (P).

A thyristor blocking layer having slight doping of a second type of conductivity opposite to the said first type (N).

A thyristor control layer having high doping of the first type (P).

A thyristor emitter layer having high doping of the second type (N).

In the said diode zone, diode layers superimposed in the thickness of that plate in the following order from the said first face to the said second face.

A diode contact layer having high doping of the second type (N+).

A diode blocking layer having slight doping of the second type (N), in continuity with the said thyristor blocking layer.

A diode injection layer having high doping of the first type P+ in continuity with the said thyristor control layer;

A first main electrode in contact on the said first face with the said thyristor injection layers and diode contact layers;

A second main electrode in contact on the said second face with the said thyristor emitter layers and diode injection layers;

A control electrode in contact with the said thyristor control layer remote, from the said diode injection layer; characterized in that an extra diode layer having doping of the first type (P) is inserted between the said diode contact layer and the said diode blocking layer, the thickness of the diode contact layer and the extra layer forming an assembly together being substantially equal to the thickness of the thyristor injection layer;

The concentration of doping impurities being at a same distance from the said first face, slighter in the said extra layer than in the thyristor injection layer.

At a distance from the said first face corresponding to the middle of the thickness of the said extra layer, the concentration of doping impurities is preferably at least three times slighter in the said extra layer than in the said thyristor injection layer.

By means of the accompanying diagrammatic FIGS. 1 to 8, an embodiment of the invention having no limiting character will be described hereinbelow.

Elements which correspond in several of these figures are designated therein by the same reference numerals.

FIGS. 1 to 8 show diametrical cross-section views of a reverse conduction thyristor according to the invention subsequent to successive stages in the manufacturing thereof.

In the following description, the words "the thyristor" and "the diode" will designate respectively the ordinary thyristor and the diode which must be integrated in the reverse conduction thyristor according to the invention.

A reverse conduction thyristor according to the invention can be manufactured as follows:

Starting with a silicon plate 2 of N type having a resistivity comprised between 50 and 100 ohms-centimeter, that plate is, for example, circular with a diameter of 43 mm and a thickness of 350 microns. Its first face is shown at the bottom of FIG. 1 and its second face is shown at the top. On these two faces, a diffusion of impurities of the P type, constituted by gallium is effected, so as to obtain two layers 6 and 4 of the P+ type on the first and second faces respectively. The conditions of that diffusion are as follows:

— Duration: 60 Hours;
— Temperature: 1225° C
— Depth: 55 microns
— Surface concentration: $5.10^{17}$ atoms per cubic centimeter.

Figure 2:
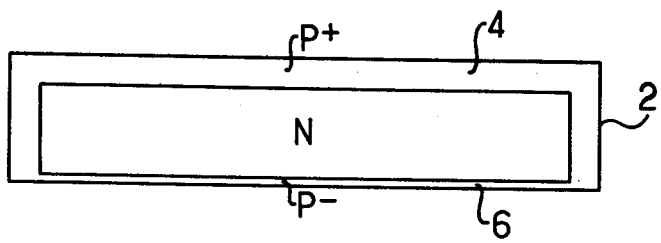

According to FIG. 2, by mechanochemical polishing, the layer 6 is brought down to a thickness of 3 to 5 microns, this causing a surface concentration for that layer which is situated at about $5.10^{15}$ atoms per cubic centimeter.

Figure 3:
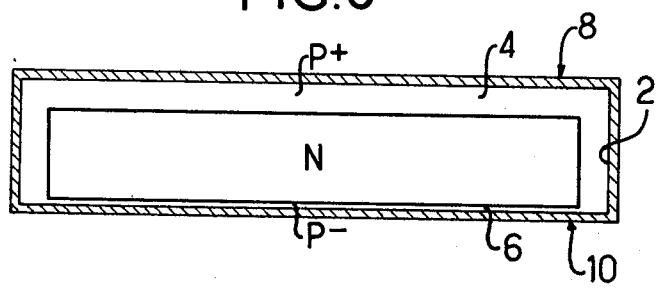

According to FIG. 3, the two faces of the plate 2 are oxydized in a damp atmosphere to obtain two layers of silica 8 and 10 having a thickness of 8000 angstroms, on the layers 4 and 8 respectively.

Figure 4:
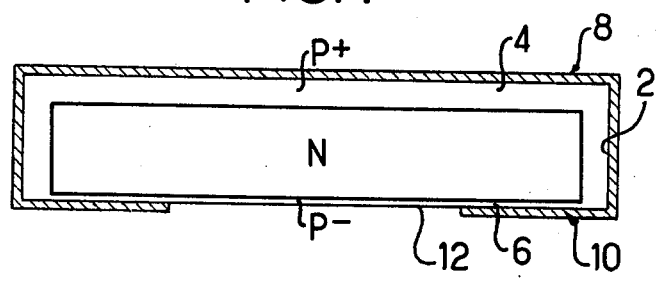

Oxydization conditions:

— Duration: 3 hours 30 minutes;
— Temperature: 1200° C;

According to FIG. 4, by photolithoengraving of the silica layer 10, a circular window 12 having a diameter of 32.7 mm is cut in its centre.

Figure 5:
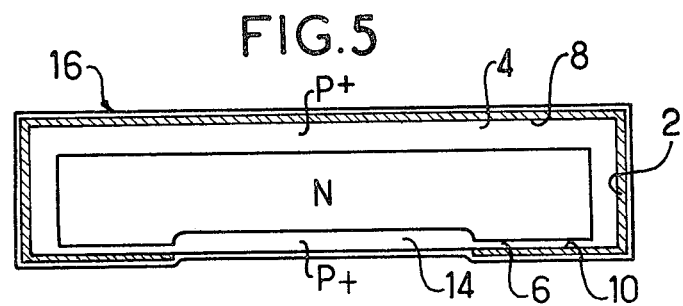

According to FIG. 5, the thyristor injection layer previously mentioned, that is, in the example described, the anode layer 14 of the thyristor, is formed. For that purpose, a diffusion of boron is effected in the following conditions:

a. Previous depositing: 1 hour 30 minutes at 1150° C in an atomosphere consisting of 95% nitrogen and 5% oxygen in contact with oxydized boron nitride plates.

b. Diffusion:

— Time: 15 hours;
— Temperature: 1200° C;
— Depth: 22 microns;
— Surface concentration: $10^{20}$ atoms per cubic centimeter.

During that diffusion of boron, the two faces of the plate 2 are covered with a further silica layer 16 containing boron.

Figure 6:
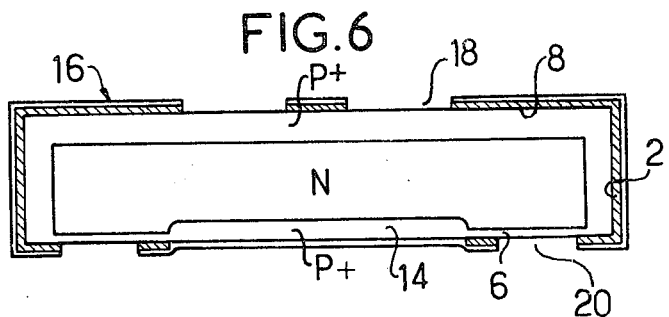

According to FIG. 6, two annular windows 18 and 20 are cut by photolithoengraving coaxially with the plate 2 through the layers of silica covering the second face and first face of that plate, respectively. The window 18 has an inside diameter of 2.5 mm, an outside diameter of 30.7 mm and should enable the forming of the thyristor emitter layer previously mentioned, that is, in the example described, the cathode of the thyristor. The window 20 has an inside diameter of 32.8 mm, an outside diameter of 41 mm and should enable the forming of the diode contact layer previously mentioned, that is, in the example described, of the cathode of the diode.

Figure 7:
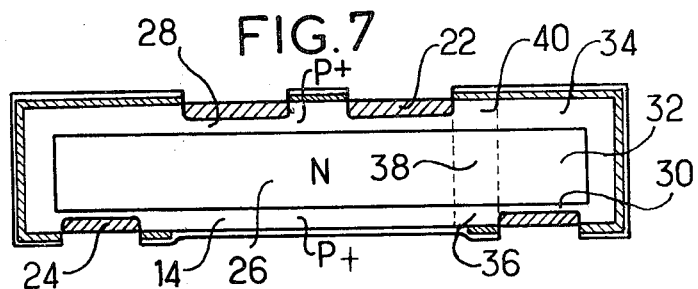

According to FIG. 7, the cathode 22 of the thyristor and the cathode 24 of the diode are formed by diffusion of impurities of the N type consisting of arsenic through the windows 18 and 20:

Diffusion conditions:
— Time: 25 hours;
— Temperature: 1235° C;
— Depths: 17 microns for the layer 22;
  20 microns for the layer 24;
— Surface concentrations: $5.10^{20}$ atoms per cubic centimeter.

The semiconductor plate then has approximately its final structure, which is coaxial. A central and cylindrical thyristor zone which is substantially limited by the outside edge of the window 18, an annular insulation zone situated between the outside edge of the window 18 and the inside edge of the window 20, and an annular and peripheral diode zone substantially coextensive with the window 20 can be seen thereon.

In the thyristor zone, there are the following layers, from the first to the second face of the plate 2:

An injection layer 14 of the P + type constituting, in the example described, an anode of the thyristor;

A thyristor blocking layer 26 of the N type having slight doping, constituted by a part of the plate 2 which has not been affected by the previously mentioned diffusion operations;

A thyristor control layer 28 of the P + type constituted by the part of the layer 4 formed by the diffusion of the N type effected through the window 18;

An emitter layer constituting a cathode 22 of the thyristor. That layer does not exist at the centre of the plate 2 to enable the connecting of a control electrode or trigger of the thyristor.

In the diode zone, there are the following layers, from the first to the second face of the plate 2:

A contact layer 24 of the N + type constituting a cathode of the diode;

An "extra" layer 30 of the P type resulting from the moving of the layer 6 at the time of the N type diffusion operation forming the contact layer 24;

A diode blocking layer 32 in continuity with the layer 26 and having the same origin;

An injection layer 34 of P + type constituting the anode of the diode and formed by the peripheral part of the layer 4.

In the insulating zone, there are, from the first to the second face of the plate 2, the following layers:

An extension 36 towards the periphery of the thyristor layer 14, that extension not being physically distinct from that injection layer as a whole;

An extension 38 common to the two blocking layers 26 and 32.

An extension 40 of the diode injection layer 34 towards the centre of the plate 2.

Figure 8:
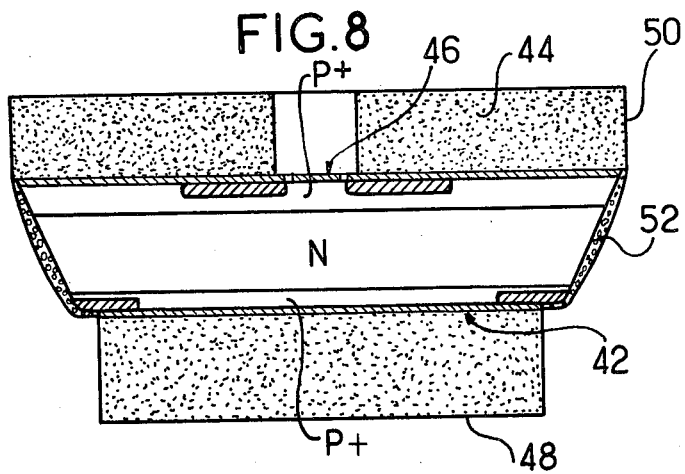

The plate shown in FIG. 7 undergoes the following operations enabling the structure shown in FIG. 8 to be obtained:

Removal of the silica layers 10 and 16.

Depositing, by evaporation in a vacuum, of a layer of aluminium twelve microns thick on the two faces of the plate;

Photoengraving of that aluminium layer so as to limit metallic electrodes on those two faces;

Those electrodes are:

On the first face of the plate 2, a first main electrode 42, which is circular and constitutes simultaneously an anode contact of the thyristor and a cathode contact of the diode;

On the second face of the plate 2, a second main electrode 44 having an annular shape, constituting simultaneously a thyristor cathode contact and a diode anode contact;

In the centre of that same second face of the plate 2, a control electrode 46 having a circular shape, constituting the trigger of the thyristor.

That electrode has a diameter smaller than the inside diameter of the window 18, so as to be quite separate from the electrode 44.

A "counter-electrode" 50 made of thick tungsten is then fixed by alloying in a furnace on the second face of the plate 2, so as to provide that plate with a good mechanical support. This counter electrode covers the main electrode 44 and is drilled with a hole at its centre to leave the passage free for a wire for connection with the trigger 46:

A bevel is then formed by micro-sanding the edges of the plate 2 so as to impart to its first face a diameter of 39 mm, less than that of its second face which is 40 mm, in order to avoid surface short-circuits between the layers 24, 30, 32 and 34;

A tungsten counter electrode 48 is then pressed on the electrode 42;

The previously formed bevel is then chemically scoured and coated with a silicone resin 52 to make isolation perfect.

Other necessary operations are not described, because they are within the understanding of people skilled in the art and more particularly the welding of a connection wire on the trigger 46 and the putting of the plate 2 in a protective housing of the conventional type.

Other arrangements which are not strictly necessary but only constitute an advantage in the majority of cases have not been shown, for they are conventional in the branch of thyristors and are not connected with the present invention.

This concerns the forming of emitter short-circuits between the thyristor control layer 28 and the main electrode 44 across the emitter layer 22 and the forming of a trigger amplifier between the control electrode or trigger 46 and the main electrode 44.

As for the gap constituted by the isolation zone between the thyristor zone and the diode zone, its width is, to great advantage, chosen close to the diffusion length of the minority carriers in the blocking layer. More precisely, the width of the extension 38 connecting the layer 26 to the layer 32 is preferably comprised between a half and four times that diffusion length. This is contained by a suitable choice of the difference between the outside diameter of the window 18 and the inside diameter of the window 20.

It is evident that other values than those which have been previously given can be used within the scope of the invention. Inasmuch as concerns, more particularly the extra layer 30, it seems preferable for the layer 6 from which it originates to have an original thickness comprised between 2 and 10 microns with a surface concentration comprised between $10^{15}$ and $10^{17}$ atoms per cubic centimeter. It is nevertheless obvious, for the man in the art, that the highest concentrations in that gap must be obtained by means which are different from those which have been described above, for example by a boron or gallium diffusion operation lasting a short time (less than an hour) after thinning or removal of the layer 6.

The thickness of that layer increases at the same time as that layer moves during the subsequent diffusion operations. It seems preferable for the final thickness of the extra layer 30 to be comprised between 5 and 30 microns with a maximum concentration of doping impurities comprised between $5.10^{14}$ and $5.10^{16}$ atoms per cubic centimeter, whereas the concentration in the thyristor injection layer is close to $10.^{18}$ at the same distance from the first face.

We claim:
1. Reverse conduction thyristor comprising:
   a semiconductor plate with a first and a second face; that plate comprising at least one thyristor zone and one diode zone each extending throughout the whole thickness of that plate, each taking up a part of the surface of that plate;
   in the said thyristor zone, thyristor layers superimposed in the thickness of that plate in the following order from the said first face to the said second face;
   a thyristor injection layer having high doping of a first type of conductivity;
   a thyristor blocking layer having slight doping of a second type of conductivity opposite to the said first type;
   a thyristor control layer having high doping of the first type;
   a thyristor emitter layer having high doping of the second type;
   in the said diode zone, diode layers superimposed in thickness of that plate in the following order from the said first face to the said second face:
   a diode contact layer having high doping of the second type N;
   a diode blocking layer having slight doping of the second type in continuity with the said thyristor blocking layer;
   a diode injection layer having high doping of the first type in continuity with the said thyristor control layer;
   a first main electrode in contact on the said first face with the said thyristor injection layers and diode contact layers;
   a second main electrode in contact on the said second face with the said thyristor emitter layers and diode injection layers;
   a control electrode in contact with the said thyristor control layer, remote from the said diode injection layer; characterized in that an extra diode layer having doping of the first type is inserted between the said diode contact layer and the said diode blocking layer, the thickness of the diode contact layer and the extra layer, together forming an assembly, being substantially equal to the thickness of the thyristor injection layer, the concentration of doping impurities being, at the same distance from the said first face, slighter in the said extra layer than in the thyristor injection layer.

2. Thyristor according to claim 1, characterized in that at a distance from the said first face corresponding to the middle of the thickness of the said extra layer, the concentration of doping impurities is at least three times slighter in the said extra layer than in the said thyristor injection layer.

3. Thyristor according to claim 2, characterized in that the maximum concentration of doping impurities in the said extra layer is comprised between $5.10^{14}$ and $5.10^{16}$ atoms per cubic centimeter.

4. Thyristor according to claim 3, characterized in that the thickness of the said extra layer is comprised between 5 and 30 microns.

5. Thyristor according to claim 4, characterized in that an isolating zone separates, throughout the whole thickness of the said plate, the said thyristor zone from the said diode zone, that insulating zone comprising:
   an extension of the said thyristor injection layer up to the said two diode contact and extra diode layers, the concentration of doping impurities being in that extension, at least three times smaller than that in that thyristor injection layer at an equal distance from the said first face, the said extra diode layer having, for an equal distance from the said first face, a concentration of doping impurities equal to that of the part of that extension which is the furthest from the first face;
   an extension common to the said two blocking layers;
   an extension of the said diode injection layer up to the said two control and thyristor emitter layers.

* * * * *